(12) United States Patent
Rachmady et al.

(10) Patent No.: US 8,969,165 B2
(45) Date of Patent: *Mar. 3, 2015

(54) SELF-ALIGNED INSULATING ETCHSTOP LAYER ON A METAL CONTACT

(71) Applicant: Intel Corporation, Santa Clara, CA (US)

(72) Inventors: Willy Rachmady, Beaverton, OR (US); James Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/178,166

(22) Filed: Feb. 11, 2014

(65) Prior Publication Data

US 2014/0227867 A1    Aug. 14, 2014

Related U.S. Application Data

(60) Continuation of application No. 12/961,138, filed on Dec. 6, 2010, now Pat. No. 8,686,517, which is a division of application No. 12/146,584, filed on Jun. 26, 2008, now Pat. No. 7,888,220.

(51) Int. Cl.
| | |
|---|---|
| *H01L 21/44* | (2006.01) |
| *H01L 29/51* | (2006.01) |
| *H01L 21/768* | (2006.01) |
| *H01L 29/66* | (2006.01) |

(52) U.S. Cl.
CPC ........ *H01L 29/511* (2013.01); *H01L 21/76834* (2013.01); *H01L 21/76897* (2013.01); *H01L 29/66545* (2013.01)
USPC ............................ 438/299; 438/595; 438/677

(58) Field of Classification Search
CPC ................. H01L 21/76834; H01L 21/768971; H01L 29/66545
USPC ................................................... 438/299, 677
See application file for complete search history.

(56) References Cited

U.S. PATENT DOCUMENTS

| | | | |
|---|---|---|---|
| 6,639,288 B1 | 10/2003 | Kunikiyo | |
| 7,790,631 B2 * | 9/2010 | Sharma et al. | ................ 438/780 |
| 2005/0127461 A1 | 6/2005 | Dey et al. | |
| 2006/0046449 A1 | 3/2006 | Liaw | |
| 2006/0091474 A1 | 5/2006 | Nabatame et al. | |
| 2006/0125051 A1 | 6/2006 | Liaw | |
| 2008/0116481 A1 * | 5/2008 | Sharma et al. | ................ 257/175 |
| 2008/0157365 A1 * | 7/2008 | Ott et al. | ........................ 257/750 |
| 2008/0197426 A1 | 8/2008 | Okazaki | |

* cited by examiner

*Primary Examiner* — Olik Chaudhuri
*Assistant Examiner* — Christine Enad
(74) *Attorney, Agent, or Firm* — Blakely, Sokoloff, Taylor & Zafman LLP

(57) ABSTRACT

A semiconductor device comprising a substrate having a transistor that includes a metal gate structure; a first oxide layer formed over the substrate; a silane layer formed on the first oxide layer; and a non-conductive metal oxide layer grown on the metal gate structure, wherein the silane layer inhibits nucleation and growth of the non-conductive metal oxide layer.

20 Claims, 3 Drawing Sheets

US 8,969,165 B2

SELF-ALIGNED INSULATING ETCHSTOP LAYER ON A METAL CONTACT

This is a Continuation application of Ser. No. 12/961,138 filed Dec. 6, 2010 which is a Divisional Application of Ser. No. 12/146,584 filed Jun. 26, 2008 now U.S. Pat. No. 7,888,220 issued Feb. 15, 2011.

BACKGROUND

As pitch scaling continues to increase transistor performance and packing density, the margin for source/drain contact separation from the gate electrode is quickly diminishing. Thus, contact shorts between the source/drain and the gate are becoming increasingly unavoidable.

BRIEF DESCRIPTION OF THE DRAWINGS

Embodiments of the present invention are understood by referring to the figures in the attached drawings, as provided below.

Features, elements, and aspects of the invention that are referenced by the same numerals in different figures represent the same, equivalent, or similar features, elements, or aspects, in accordance with one or more embodiments.

DETAILED DESCRIPTION OF EXEMPLARY EMBODIMENTS

Figure 1A:
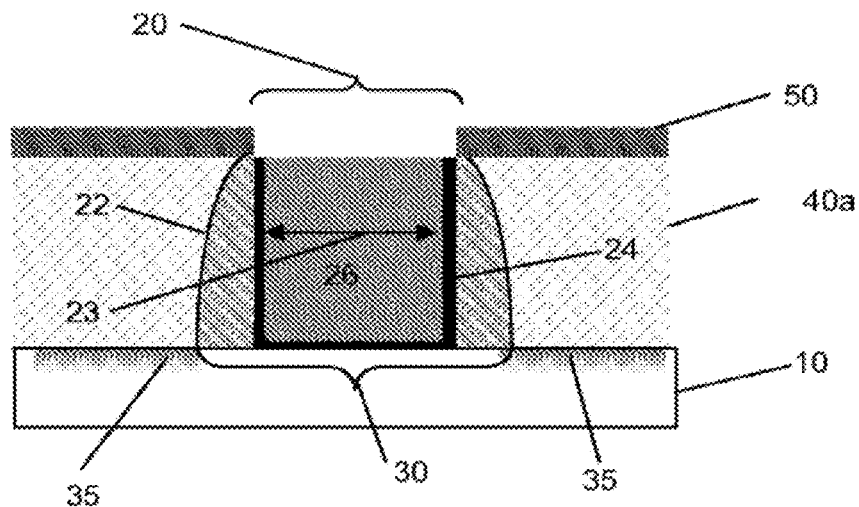
FIG. 1A shows a siloxane functionalized silicon oxide surface (silane) formed on a first interlayer dielectric oxide adjacent a metal gate region of a transistor, according to one embodiment.
Figure 1B:
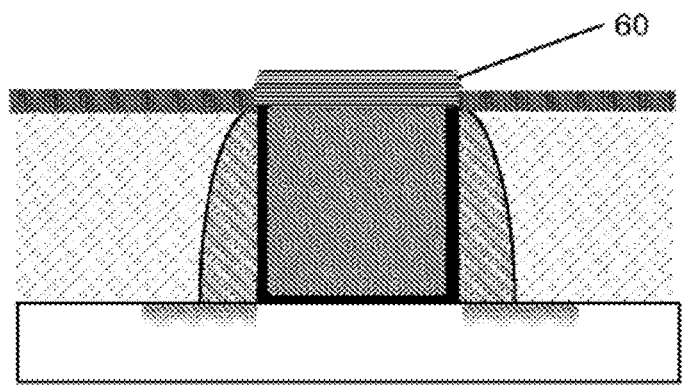
FIG. 1B shows a contact etchstop film selectively formed by atomic layer deposition over the metal gate region, according to one embodiment.

In accordance with one embodiment, a semiconductor device is fabricated by way of a substrate having a transistor that includes a sacrificial gate structure; a first oxide layer formed over the substrate; a first via formed by removal of the sacrificial gate structure; a metal gate structure formed by depositing metal into the first via; a silane layer formed on the first oxide layer; and a non-conductive metal oxide layer grown on the metal gate structure, wherein the silane layer inhibits nucleation and growth of the non-conductive metal oxide layer.

In one implementation a self-aligned insulating layer may be formed on a metal gate structure by providing a substrate having a transistor that includes a sacrificial gate structure; forming a first oxide layer over the substrate; removing the sacrificial gate structure to form a first via; depositing a metal gate structure into the first via; forming a silane layer on the first oxide layer; surface functionalizing the silane layer to inhibit nucleation and growth of a non-conductive metal oxide layer; and growing a non-conductive metal oxide layer on the metal gate structure.

The functionalized silane layer may be removed from the first oxide after growing the non-conductive metal oxide layer on the metal gate structure. A second oxide layer may be formed over the first oxide layer after removal of the silane layer. The first and second oxide layers may be etched to form a second via contacting a source drain (S/D) region of the transistor. Metal may be deposited in the second via to form S/D contacts to the S/D region. The non-conductive metal oxide layer prevents a short between the metal gate structure and the S/D contacts.

The non-conductive metal oxide layer may include at least one of HfO2 ZrO2, HfSiO, ZrSiO or a combination thereof. The silane layer may include at least one of Alkylsilanes and perfluoroalkylsilanes possessing three hydrolytically sensitive Si—X linkages, wherein X comprises at least one of Cl, OMe, OEt, or NMe2, wherein Me is a methyl group, and Et is an ethyl group. The sacrificial gate structure may comprise substantially vertical polysilicon sidewalls with non-conductive spacer layers formed adjacent to the substantially vertical sidewalls of the sacrificial gate structure.

In some embodiments, Alkyl and perfluoroalkylsilanes possessing three hydrolytically sensitive Si—X bond linkages (e.g., X=Cl, OMe, OEt, NMe2 etc., and Et=ethyl group, Me=methyl group) may selectively attach to hydrophilic silicon oxide and silicon nitride surface through formation of Si—O—Si linkages between the silane and the oxide surface. From these anchors, dense, thermally stable monolayers of oligomerized silanes can assemble at the oxide or nitride surface, leading to highly hydrophobic surfaces, the result of the alkyl or perfluoroalkyl groups being directed outward from the surface.

The silane functionalization of oxide and nitride surfaces is selective to the hydrophilic oxide and nitride surface over that of various metals since the metal surfaces do not possess (reactive) hydroxyl or other anchor points. Metal surfaces which oxidize readily, lead to hydroxylated and potentially reactive surfaces.

Protection of the metal surface can be achieved by various reversible functionalization strategies (e.g., arylation, hydrometallation, alkylation, etc.) to render the metal surface hydrophobic and impervious to reaction with siloxanes. Once rendered hydrophobic, the metal surface becomes impervious to reaction with siloxane, and thus allows the silicon oxide to be functionalized with siloxanes. The metal protecting group can then be liberated by heating to a temperature where the introduced groups desorb from metal but not from siloxane.

FIG. 1A shows a siloxane functionalized silicon oxide surface (silane) formed on a first interlayer dielectric oxide adjacent a metal gate region of a transistor, according to one embodiment. The transistor is formed on a substrate 10. Substrate 10 may comprise one of a variety of semiconductor materials, including silicon. A metal gate structure 20 may be formed above a channel region 30 portion of the surface of the substrate 10 separating a source and a drain (S/D) region 35. The metal gate structure 20 may be formed by a replacement metal gate (RMG) process, well known in the art of integrated circuit fabrication.

A gate structure using the RMG process may be formed, for example, of polysilicon in contact with insulating spacers 22, wherein the spacers 22 are formed adjacent to the polysilicon having adjacent sidewalls 23. The polysilicon may be a sacrificial material (i.e., provided for the formation of related structures, such as the insulating spacers 22). The polysilicon may be removed and a Hi-K dielectric layer 24 may be disposed on the sidewalls 23 and bottom of the remaining via of gate structure 20. The removed polysilicon may be replaced with a metal contact in order to apply an electric field to a channel region 30 of the transistor across the Hi-K dielectric layer 24. Exemplary Hi-K dielectric materials include oxides and silicates of hafnium and zirconium, such as HfO2, ZrO2, HfSiO, or ZrSiO.

In one embodiment, the via of gate metal structure 20 may be filled with a suitable metal 26. In one embodiment, metal 26 may be a single metal. In one embodiment, metal 26 may be a series of more than one deposited metals. In one embodiment, one or more layers of metal 26 may be deposited by electroless plating to fill the gate structure 20 substantially to the level of the top of the insulating spacer 22. In one embodiment a seed layer of metal 26 may be deposited by one process, and a second layer of metal 26 may be deposited by another process. In one embodiment, Cu may be deposited to fill the via of metal gate structure 20.

A first insulating interlayer dielectric (ILD) 40a may be formed over substrate 10. By selecting various deposition, masking and etching procedures, the order of formation of the metal gate structure 20 and the first ILD 40a may be varied. The ILD 40a and deposited copper may be planarized, leaving the top of the spacers 22 and metal 26 exposed.

In one embodiment, an oligomerized silane layer 50 may be disposed on the planarized surface. An etchstop 60 may be deposited over the planarized surface using various deposition methods, including atomic layer depositions. Suitable materials for etchstop 60 include, for example, $HfO_2$, ZrO2, or silicates of Hf or Zr. However, the siloxane functionalized ILD 40a and exposed spacer 22 are inert to atomic layer deposition due to the functionalization properties of oxides and nitrides versus metals, as described above. Therefore, the silane layer 50 inhibits atomic layer deposition of etchstop 60 materials on ILD 40a and spacers 22, but does not inhibit deposition on metal 26.

Figure 1C:
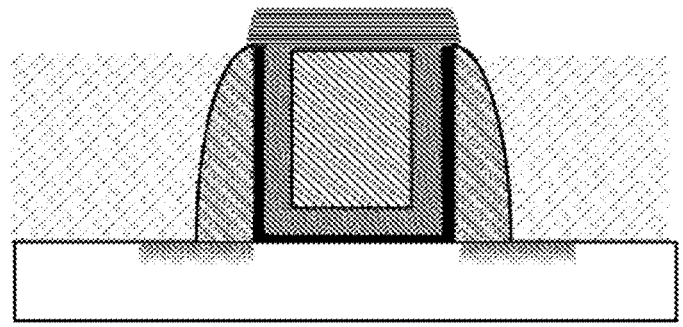
FIG. 1C shows a gate metal region capped by the contact etchstop after removal of the functionalized silane layer, according to one embodiment.

The non-conductive etchstop 60 may cap and protect the gate metal 26 during subsequent fabrication processes (provided in further detail below) to form S/D contacts. Protecting the gate region 20 by formation of the self-aligned cap provides a relaxed margin of CD for S/D contact registration, thus preventing shorts between Source/Drain and Gate electrodes even as CD scaling leads to reduced device feature size. FIG. 1C shows a gate metal region capped by the etchstop 60 after removal of the functionalized silane layer 50, according to an embodiment.

Figure 1D:
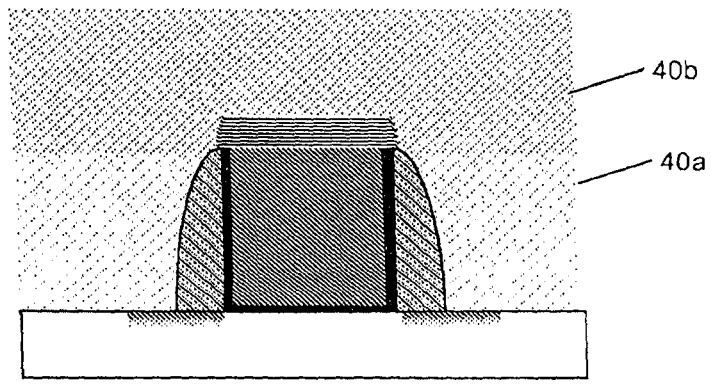
FIG. 1D shows the transistor metal gate structure and etchstop film coated with a second interlayer dielectric oxide, according to one embodiment.

FIG. 1D shows the metal gate structure 20 and etchstop 60 coated with a second interlayer dielectric 40b, according to an embodiment. In one embodiments, electrical contact to the gate structure 20 may formed by etching a via to the gate through interlayers 40 a and 40b. The gate contact via position may be arranged perpendicular to the S/D contacts so that gate and S/D vias do not overlap. For example, from a top down view, if S/D contacts are registered to the gate structure 20 on an x-axis, then the gate contact via will be registered to the gate structure on a y-axis.

Figure 1E:
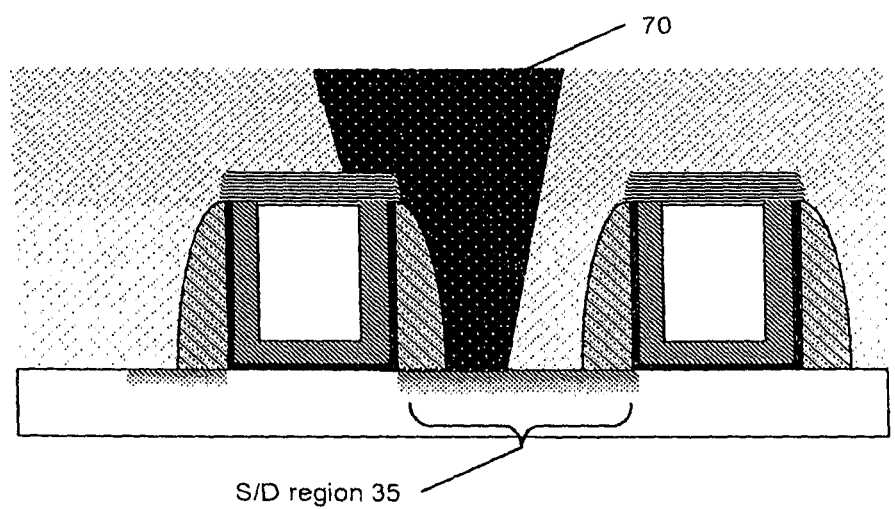
FIG. 1E shows a S/D contact formed in the region between two metal gate structures, wherein the registration of the S/D contact may be relaxed due to the insulating etchstop layer on the metal gate region, according to one embodiment.

In one embodiment, FIG. 1E shows an S/D metal contact 70 formed in the region between two metal gate structures 20 arranged on the substrate apart from each other. S/D metal contact 70 may be formed of the same metal as metal 26 or another metal. S/D metal contact 70 may be formed in the same manner as metal 26 or in another deposition manner. The source or drain region 35 is configured at the substrate 10 surface between the two metal gate structures 20. Whereas, a via is formed preferably equally located between the two metal gate structures 20.

The previously exposed top portion of the metal gate structures 20 are capped by etchstops 60 and are further encapsulated by ILDs 40a and 40b, and spacers 22. Spacers 22 are selected from materials resistant to etchants used to form the vias in ILDs 40a and 40b. In one embodiment, if ILDs 40a and 40b are oxides, spacers 22 may be non-conductive nitrides. CD registration of the via to form the S/D metal contact 70 may be relaxed due to the existence of insulating etchstop 60 layer on the top metal gate region and the spacers 22, both of which are selected to be resistant to the via etchant.

Figure 2:
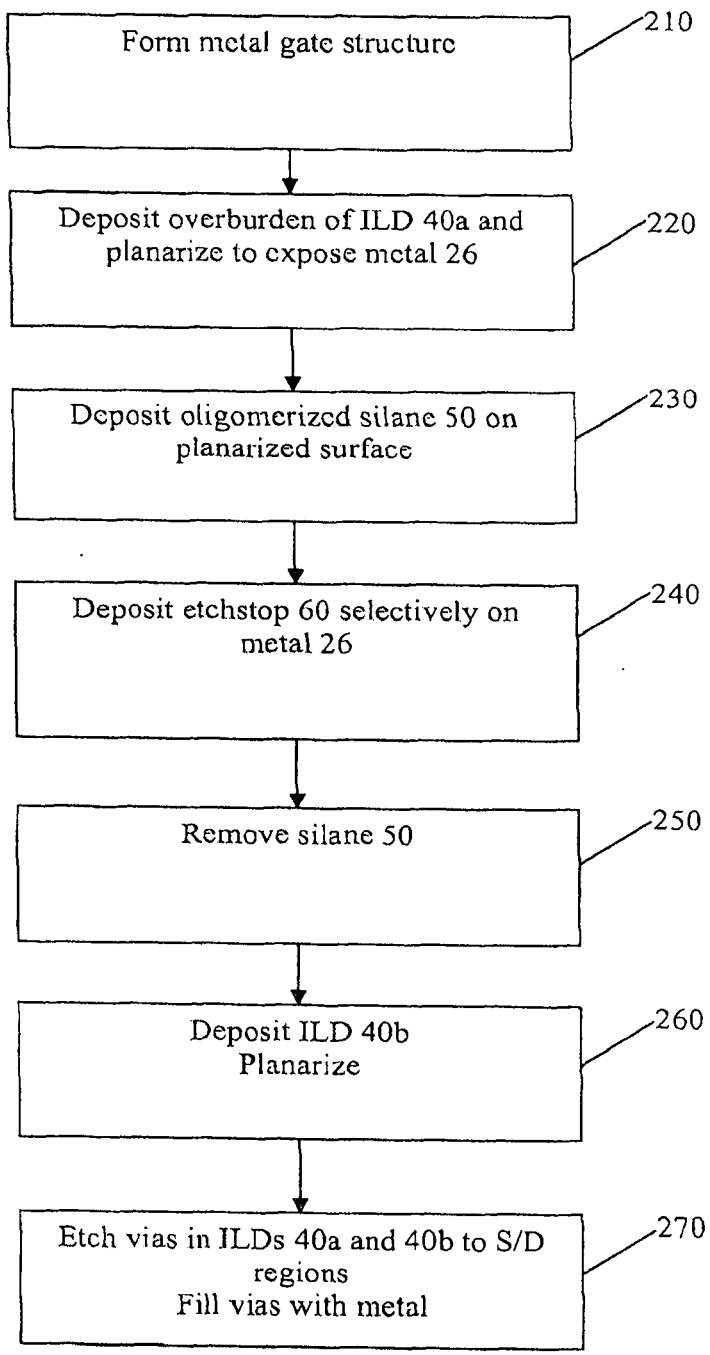
FIG. 2 illustrates a process flow of a method of making a self-aligned insulating etchstop layer on a metal contact.

In one embodiment, FIG. 2 illustrates a process flow of a method 200 of making a self-aligned insulating etchstop layer on a metal gate contact. A metal gate structure is formed using a replacement metal gate (RMG) process (Block 210). The metal gate contact includes a metal gate structure 20 and adjacent non-conductive spacers 22. An ILD 40a is deposited to overburden the metal gate structure 20 and the overburden of ILD 40a is planarized to expose the metal 26 in the metal gate structure 20 (Block 220).

Oligomerized silane 50 may be deposited over the planarized structure (Block 230). Whereas functionalized oligomerized silane may inhibit growth on ILD 40a and spacers 22, selected etchstop 60 material may be selectively deposited on the metal 26 (Block 240) using one or more deposition processes. A deposition process such as atomic layer deposition may be used, but equivalent methods of disposing an etchstop cap 60 may be used as well.

The silane 50 may then be removed from the surface of the ILD 40a (Block 250). A second dielectric layer, ILD 40b, may be grown over ILD 40a, covering etchstop 60 capped gate structure 20 at the same time, and ILD 40a may be planarized as needed (Block 260). Using, for example, photolithographic patterning, a via may be etched in ILD 40a and 40b to the source or drain (S/D) region between the metal gate structures 20 (Block 270).

The vias may be filled with metal to form S/D metal contacts 70 the S/D regions. Since the metal 26 of gate metal structures 20 are insulated by spacers 22 and a self-aligned etchstop 60 cap, registration of the mask to form the vias for S/D metal contacts 70 is not a critical dimension (CD) as no shorting between S/D metal contacts 70 and gate metal will occur.

The various embodiments described above have been presented by way of example and not by way of limitation. Thus, for example, while embodiments disclosed herein teach the formation of a protective capping etchstop 60 by atomic layer deposition, other methods of providing protective cap are also within the scope of embodiments.

It should be understood that the processes, methods, and the order in which the respective elements of each method are performed are purely exemplary. Depending on the implementation, they may be performed in a different order or in parallel, unless indicated otherwise in the present disclosure.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multi-chip package (such as a ceramic carrier that has either or both surface interconnections or buried interconnections).

In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for forming a semiconductor device, comprising:
   providing a substrate having a transistor that includes a sacrificial gate electrode;
   forming a first interlayer dielectric (ILD) over the substrate and the sacrificial gate electrode;
   planarizing the first ILD, such that a top surface of the first ILD is substantially coplanar with an exposed top surface of the sacrificial gate electrode;
   removing the sacrificial gate electrode to form a first via;
   disposing a metal gate electrode into the first via, wherein a top surface of the metal gate electrode is substantially coplanar with the top surface of the first ILD;
   exposing the top surfaces of the first ILD and the metal gate electrode to a silane that selectively functionalizes the top surface of the first ILD and not the top surface of the metal gate electrode, wherein the functionalized top surface of the first ILD inhibits growth of a non-conductive metal oxide layer; and
   growing a non-conductive metal oxide layer on the metal gate electrode.

2. The method of claim 1, further comprising:
   disposing a gate dielectric layer on a bottom surface of the first via prior to disposing the metal gate electrode into the first via.

3. The method of claim 2, further comprising:
   disposing a gate dielectric layer on sidewalls of the first via prior to disposing the metal gate electrode into the first via.

4. The method of claim 3, wherein exposed surfaces of the gate dielectric layer are selectively functionalized with the silane to inhibit nucleation of a non-conductive metal oxide layer after the metal gate electrode is disposed into the first via.

5. The method of claim 1, wherein the transistor further includes non-conductive spacer layers disposed along the sidewalls of the sacrificial gate electrode.

6. The method of claim 5, wherein the top surface of the first ILD is substantially coplanar with a top surface of the non-conductive spacer layers after the first ILD has been planarized, and wherein the exposed surfaces of the non-conductive spacer layers are selectively functionalized with the silane to inhibit growth of a non-conductive metal oxide layer.

7. The method of claim 1, further comprising removing the silane from the first ILD after growing the non-conductive metal oxide layer on the metal gate electrode.

8. The method of claim 7, further comprising:
   forming a second ILD over the first ILD after removal of the silane;
   etching the first and second ILDs with an etching process to form a contact via contacting a source drain (S/D) region of the transistor, wherein the non-conductive metal oxide layer is resistant to the etching process; and
   disposing a second metal into the contact via to form S/D contacts to the S/D region, wherein the non-conductive metal oxide layer prevents a short between the metal gate electrode and the S/D contacts.

9. The method of claim 1, wherein the non-conductive metal oxide layer comprises at least one of $HfO_2$, $ZrO_2$, HfSiO, ZrSiO or a combination thereof.

10. The method of claim L further comprising growing the non-conductive metal oxide layer on the metal gate electrode by atomic layer deposition.

11. The method of claim 1, wherein the silane is selected from the group consisting of alkylsilane and perfluoroalkylsilane.

12. The method of claim 11, wherein the silane selected from the group consisting of alkylsilane and perfluoroalkylsilane possesses three hydrolytically sensitive Si—X linkages, wherein X comprises at least one of Cl, OMe, OEt, or NMe2, and wherein Me is a methyl group, and Et is an ethyl group.

13. A method for forming a semiconductor device, comprising:
   providing a substrate having a transistor that includes a sacrificial gate electrode;
   forming a first interlayer dielectric (ILD) over the substrate and the sacrificial gate electrode, wherein a top surface of the first ILD is substantially coplanar with an exposed top surface of the sacrificial gate electrode;
   removing the sacrificial gate electrode to form a first via;
   disposing a metal gate electrode into the first via, wherein a top surface of the metal gate electrode is substantially coplanar with the top surface of the first ILD;
   exposing the top surfaces of the first ILD and the metal gate electrode to a silane that selectively functionalizes the top surface of the first ILD and not the top surface of the metal gate electrode, wherein the functionalized top surface of the first ILD inhibits growth of a non-conductive metal oxide layer;
   growing a non-conductive metal oxide layer on the metal gate electrode;
   forming a second ILD over the first ILD and the non-conductive metal oxide layer;
   etching through the first and second ILD layers with an etching process, wherein the non-conductive metal oxide layer is resistant to the etching process; and
   disposing a second metal in the contact via to form S/D contacts to the S/D region, wherein the non-conductive metal oxide layer prevents a short between the metal gate electrode and the S/D contacts.

14. The method of claim 13, further comprising:
   disposing a gate dielectric layer on a bottom surface of the first via prior to disposing the metal gate electrode into the first via.

15. The method of claim 14, further comprising:
   disposing a gate dielectric layer on sidewalls of the first via prior to disposing the metal gate electrode into the first via.

16. The method of claim 15, wherein exposed surfaces of the gate dielectric layer are selectively functionalized with the silane to inhibit nucleation of a non-conductive metal oxide layer after the metal gate electrode is disposed into the first via.

17. The method of claim 13, wherein the transistor further includes non-conductive spacer layers disposed along the sidewalls of the sacrificial gate electrode.

18. The method of claim 17, wherein the top surface of the first ILD is substantially coplanar with a top surface of the non-conductive spacer layers, and wherein the exposed surfaces of the non-conductive spacer layers are selectively functionalized with the silane to inhibit growth of a non-conductive metal oxide layer.

19. A method for forming a semiconductor device, comprising:

providing a substrate having a transistor that includes a sacrificial gate electrode and non-conductive spacer layers formed along sidewalls of the sacrificial gate electrode;

forming a first interlayer dielectric (ILD) over the substrate, the sacrificial gate electrode and the non-conducting spacer layers;

planarizing the first ILD, such that a top surface of the first ILD is substantially coplanar with exposed top surfaces of the sacrificial gate electrode and the non-conductive spacer layers;

removing the sacrificial gate electrode to form a first via;

disposing a gate dielectric material along a bottom surface and sidewalls of the first via to form a gate dielectric layer;

disposing a metal gate electrode into the first via, wherein a top surface of the metal gate electrode is substantially coplanar with the top surface of the first ILD;

exposing the top surfaces of the first ILD, the non-conductive spacer layers, the gate dielectric material, and the metal gate electrode to a silane that selectively functionalizes top surfaces of the first ILD, the non-conductive spacer layers, and the gate dielectric material, but not the metal gate electrode, wherein the functionalized top surfaces inhibit the growth of a non-conductive metal oxide layer;

growing a non-conductive metal oxide layer on the metal gate electrode;

removing the silane from the top surfaces of the first ILD, the non-conductive spacer layers, and the gate dielectric;

forming a second ILD over the first ILD, the non-conductive spacer layers, the gate dielectric layer, and the non-conductive metal oxide layer;

etching through the first and second ILD layers with an etching process, wherein the non-conductive spacer layer, the gate dielectric layer, and the non-conductive metal oxide layer are resistant to the etching process; and disposing a second metal in the contact via to form S/D contacts to the S/D region, wherein the non-conductive metal oxide layer prevents a short between the metal gate electrode and the S/D contacts.

20. The method of claim 19, wherein the silane is selected from the group consisting of alkylsilane and perfluoroalkylsilane, wherein the silane selected from the group possesses three hydrolytically sensitive Si—X linkages, wherein X comprises at least one of Cl, OMe, OEt, or NMe2, and wherein Me is a methyl group, and Et is an ethyl group.

* * * * *